United States Patent
Laquai et al.

(10) Patent No.: US 7,260,493 B2
(45) Date of Patent: Aug. 21, 2007

(54) TESTING A DEVICE UNDER TEST BY SAMPLING ITS CLOCK AND DATA SIGNAL

(75) Inventors: Bernd Laquai, Stuttgart (DE); Joerg-Walter Mohr, Eutingen (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/353,662

(22) Filed: Feb. 14, 2006

(65) Prior Publication Data

US 2006/0247881 A1 Nov. 2, 2006

(30) Foreign Application Priority Data

Apr. 22, 2005 (EP) ................... 05103301

(51) Int. Cl.
*G06F 19/00* (2006.01)
(52) U.S. Cl. ............... 702/117; 365/233; 702/80; 714/738
(58) Field of Classification Search .......... 702/78, 702/79, 80, 107, 108, 117; 714/738; 327/159; 324/76.13; 365/201, 233

See application file for complete search history.

(56) References Cited

U.S. PATENT DOCUMENTS

| | | | |
|---|---|---|---|
| 3,731,210 A * | 5/1973 | Mollod | 327/159 |
| 4,876,655 A | 10/1989 | Carlton et al. | 702/80 |
| 5,835,506 A * | 11/1998 | Kuglin | 714/738 |
| 6,894,945 B2 * | 5/2005 | Sawada | 365/233 |
| 2005/0080580 A1 | 4/2005 | Shuusuke | 702/117 |

FOREIGN PATENT DOCUMENTS

| | | |
|---|---|---|
| JP | 01164118 | 6/1989 |
| JP | 2000314767 | 11/2000 |

* cited by examiner

*Primary Examiner*—John Barlow
*Assistant Examiner*—John Le
(74) *Attorney, Agent, or Firm*—Ohlandt, Greeley, Ruggiero & Perle, L.L.P.

(57) ABSTRACT

There is provided a method that includes (a) sampling a data signal and a clock signal by applying strobes for obtaining a corresponding bit values each for the data signal and for the clock signal, each of the strobes having a different phase offset with respect to a tester clock signal, (b) deriving first comparison results for the bit values of the data signal by comparing the bit values of the data signal each with an expected data bit value of expected data, (c) deriving second comparison results for the bit values of the clock signal by comparing the bit values of the clock signal each with an expected clock bit value, (d) deriving for the strobes combined comparison results by applying logical operations each on pairs of corresponding first and second comparison results, and (e) deriving a test result based on the combined comparison results.

15 Claims, 13 Drawing Sheets

Data Errors

| 0 | 0 | 0 | 0 |
| 0 | 0 | 0 | 0 |
| 0 | 0 | 0 | 0 |
| 0 | 0 | 0 | 1 |
| 1 | 0 | 1 | 1 |

Clock Errors

| 1 | 1 | 1 | 1 |
| 1 | 1 | 1 | 0 |
| 0 | 1 | 0 | 0 |
| 0 | 0 | 0 | 0 |
| 0 | 0 | 0 | 0 |

Boolean OR (Clock and Data Errors)

| 1 | 1 | 1 | 1 |
| 1 | 1 | 1 | 0 |
| 0 | 1 | 0 | 0 |
| 0 | 0 | 0 | 0 |
| 1 | 0 | 1 | 1 |

Fig. 5

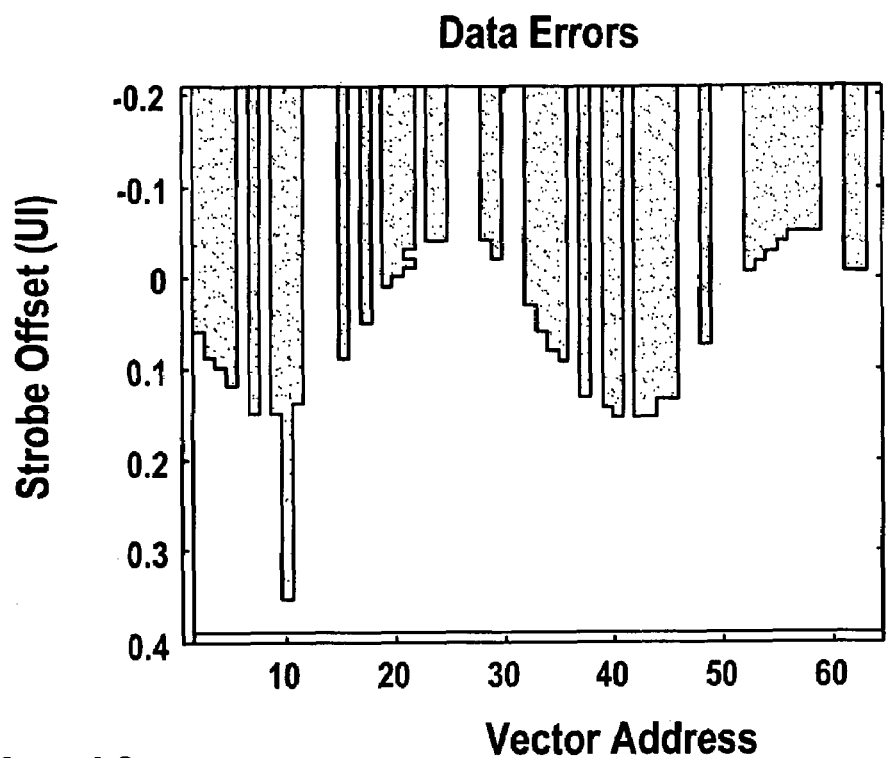
Fig. 10
Fig. 11
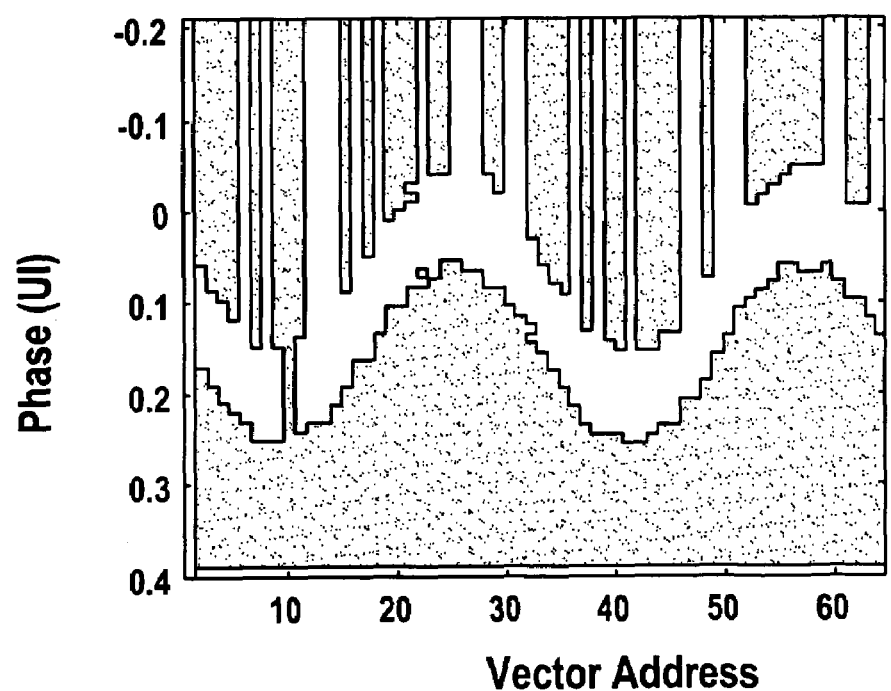

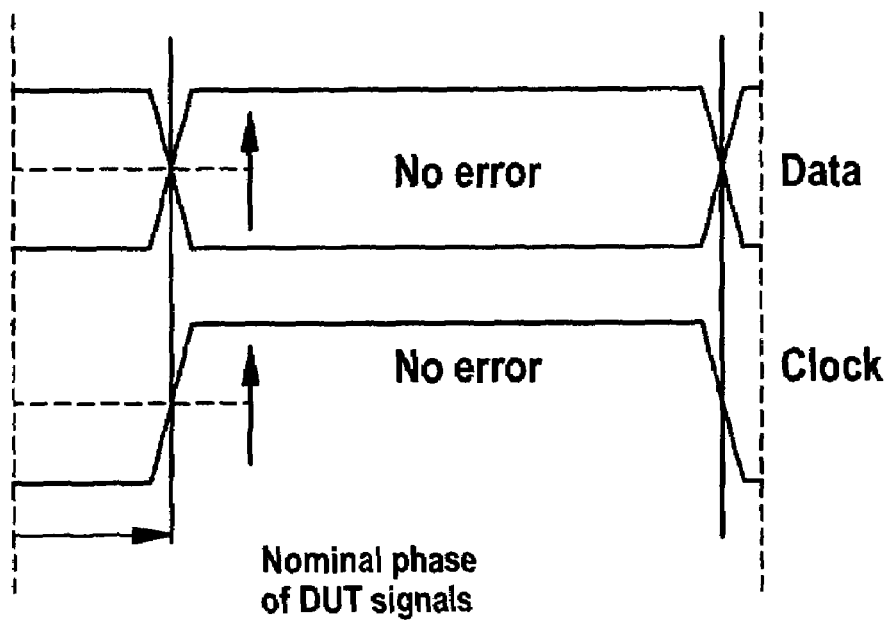
Fig. 13a
Fig. 13b
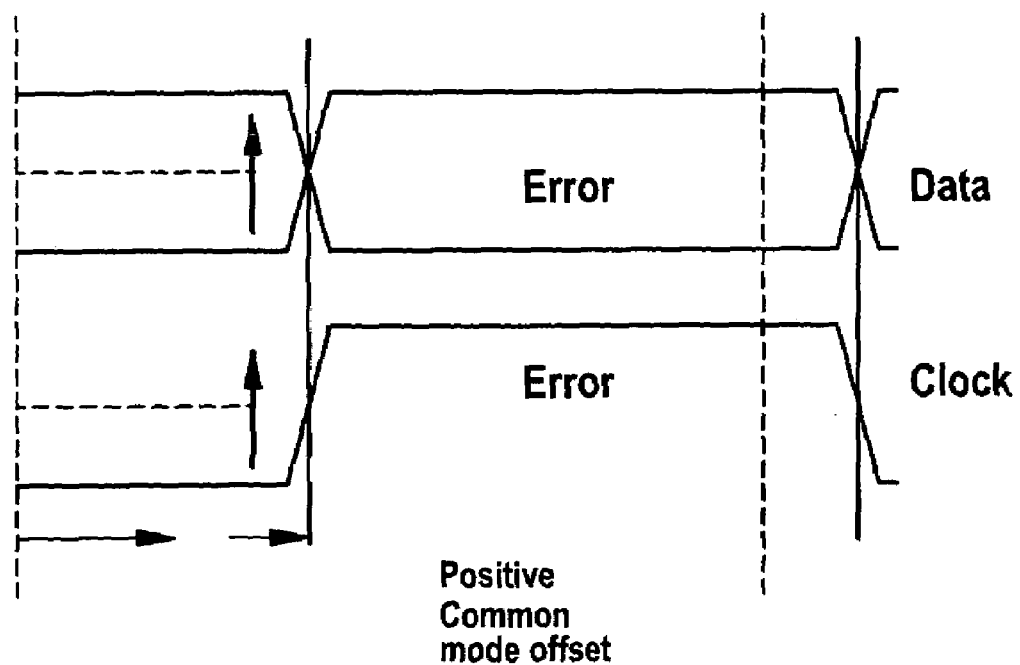

TESTING A DEVICE UNDER TEST BY SAMPLING ITS CLOCK AND DATA SIGNAL

BACKGROUND ART

1. Field of the Invention

The present invention relates to testing a device under test.

2. Discussion of the Background Art

A source synchronous input/output (I/O) interface is designed to handle data transfer using a local clock domain. I.e., the timing of the data bits being transferred from a data transmitting device to a data receiving device is referenced to the local clock of that device. In other words, the timing of the data is not referenced to an absolute timing scheme as provided by a system clock of a data receiving system, which has both devices as constituent parts. Thus, a bit stream corresponding to a clock information accompanies one or more parallel bit streams of data. At the receiver's side these data bits may then be buffered and linked to that clock information in order to recover and retrieve the information in an appropriate timing scheme.

A reason for implementing a source synchronous interface is that with increasing throughput of data in high speed computational systems, which recently crossed the barrier of 1 Gigabit per second, limited signal propagation speed along interconnects in those systems becomes a dominant factor in respect of the setting of timing schemes in each device of such a system. Due to differing interconnect lengths, if measured from a common clock device, transmitting and receiving devices which communicate via an interface may acquire deviating timing information from the system clock, that is provided with a constant or even variable skew.

Recent source synchronous I/O bus architectures use the forwarded local clock information just as a frequency reference and adjust the phase for each of the parallel bit lines. The static skew of the individual data bit lines is adjusted during link up using dedicated training sequences.

Further, these interfaces are capable of handling common mode phase variations of the clock and data information, i.e., jitter. Source synchronous operation of the communication is thereby enabled despite the presence of thermal drifts and/or supply voltage variations. This means that the original purpose of mainly covering a static skew difference between system clock and local I/O data is extended to also cover dynamic clock drifts and higher frequency common mode jitter of the local I/O interface clock and its associated data.

In order to ensure a defined functional operation of a device, such device needs to be tested along with the core logic of such device. Such a test is usually performed using Automatic Test Equipment (ATE). Thereby, defined sequences of data bits are input as a stimulus signal to a device under test (DUT), which comprises, e.g., a data transmitting or receiving portion of a source synchronous interface. Having performed logical operations according to a dedicated test program, the data being processed are transmitted back to the ATE in response to the input stimulus signal via the source synchronous interface, i.e. data bits as well as its associated local clock information.

While jitter and drift in a source synchronous interface may be appropriately handled in the case of a computational system comprising, e.g., two communicating chips, common ATE's testing the interface of one of the chips use fixed strobes to validate the data and clock information. Common mode jitter or drift then disadvantageously tend to close a data eye of a transferred bit more rapidly than in the case of the two chips.

One solution is to provide the ATE with a receiving portion of a source synchronous interface, such that the DUT could be tested under similar conditions as during operation in the target system. However, different propagation delays for the spatially distributed I/O pins of the ATE have to be taken into account when designing the test equipment.

SUMMARY OF THE INVENTION

It is thus an object of the invention to provide an advanced testing a device under test.

A device under test, which is capable of communicating with a test device via a data interface, is tested with respect to functional as well as specification-based characteristics as will be described in the following. Therein, the device under test may—but is not necessarily limited to—operate in a data transmitting mode as well as in data receiving mode.

Functional characteristics relate to the behavior of, e.g., a core logic, that such a device generally comprises, in response to a digital data signal, that is input to the device. The digital data signal being input is made of a sequence of bit cycles, with each bit cycle carrying bit information represented by either a "0" or a "1". The specific sequence of bits input to the device is arranged to yield a vendor designed sequence of operations carried out by the core logic. The sequence of bits may comprise, e.g., data on which the operations are performed as well as instruction data to, e.g., a test specific controller supplied to the device.

The core logic then outputs a processed digital signal in response to that data signal that has previously been input. The invention is not restricted to the particular steps with which the processing and output of a test bit sequence is initiated. It is even possible, that the device under test generates its own sequence of bit information in a data signal sent to the test device. In any case, as the data and the operations performed on the data are known, the output result can be compared with a predetermined sequence of bit information.

Specification based characteristics relate to, among others, the timing behavior of the device. While the core logic may operate correctly with respect to the logical functions performed, unacceptable time delays of individual bit cycles or more precisely of their transitions represented by rising or falling edges with respect to a clock may lead to erroneous readout results on a data receiver's side. Acceptable time delays are specified by the vendor of the device.

The test device may be an automatic test equipment (ATE). The incoming signals originating from the interface refer to a clock signal and one or more data signals that are related to the clock signal. It is as well possible, that more than one signal is tested with respect to the data and the clock signals. For example, four groups of each eight data signals, wherein each group of data signals is associated with its own clock signal, may be tested this way.

According to an embodiment, a sequence of strobe signals, i.e. a strobe, is generated for each of the incoming signals, which is employed to validate the bit information content of each bit cycle. A strobe denotes a time instance, at which an incoming signal is sampled. An application of strobes thus leads to a time discrete output signal of a respective sampling unit. In an as simple as possible case, the frequency of the strobe corresponds to the cycle frequency of the source synchronous interface. However, the strobe may differ in phase with respect to the bit stream of the data and/or clock signals. The timing of the strobe itself is based on a clock of the test device.

Using a number of strobes each having a distinct phase difference with respect to the individual bit streams, the bit cycles of the data as well as the clock signal are scanned through in discrete steps of different phase, when validating the bit content. This means that instead of using the clock to validate or sample the data signal bit content, both signals—the clock and the one or more data signals—are investigated with respect to plain functional and timing errors.

Each strobe that is used to validate the signal represents one value of the phase difference between strobe and tester clock. Basis is the tester clock. It is important to notice, that each pulse of a strobe is related to one error bit.

The scanning procedure can be performed sequentially or in parallel with multiple strobes. In the former case, the test bit sequence has to be repeated for each of strobes, while in the after case multiple strobes are placed within the same cycle of clock or data, each of these strobes corresponding to one of the number of strobes according to the invention.

Thus, in one embodiment, it is possible to have one strobe per cycle with all strobes having the same phase with respect to the clock and data signals. Then, a test sequence is initiated using this strobe, wherein the signals are sampled. In what follows, the test sequence is also called a "shot". Subsequently, a next strobe is generated for a next shot/test sequence with each cycle of the shot having just one strobe with a second value of the phase, which differs from the previous phase of the first shot or strobe. For example, 50 shots are performed with each one strobe/phase setting.

In another embodiment, it is possible to have the same number of strobes per cycle as there are strobes planned for the current test sequence. Just one test sequence is shot and each cycle is covered with strobes according to the phase associated with the corresponding strobe. For example, the test may comprise just one shot, which is provided with 50 strobes per cycle, or 50 strobe/phase settings, respectively.

In a still further embodiment, it is possible to perform a combined test by, e.g., performing 10 shots with each 5 strobes per cycle, each strobe having a different phase, and also changing the phase settings of the 5 strobes from shot to shot.

The errors are detected in a capture and compare scheme, wherein the data bit cycles are compared with the expected and predetermined bit sequence, and the clock bit cycles are compared with the sequence of alternating bit information. The result is a pass or fail condition for each of the bit cycles, and for each value of the phase difference, and for each of the signals tested.

The result may e.g. be represented by a matrix, wherein rows provide a value of the phase difference of the strobe and columns represent a number of a corresponding cycle that is sampled. Each signal, either data or clock, then has its own matrix. The entries in the matrix are "pass" or "fail", "error" or "not error" or "0" or "1", etc. It is without saying, that any other appropriate data structure can also be arranged to represent the results and that the invention is not limited to selection of data representations as depicted in the embodiments according to this document.

The size of the matrix consequently depends upon the number of cycles, which may be vendor specific, and upon the resolution of the phase scanning, i.e., on the time between adjacent strobes of different strobes. According to the invention this eventually large amount of data volume is stepwise reduced to finally just one accept or reject decision using Boolean operations performed on pass or fail conditions as retrieved according to this method for each cycle and phase difference, represented by, e.g., entries in the matrix.

In a first step, the pass or fail conditions of each data signal are combined with those of the clock signal using a first Boolean operation. Which operation is actually to be applied to both respective conditions (clock and data) depends upon what conditions have to be satisfied by the strobe signals with respect to the data and the clock signal.

For example, in the case that a clock signal is to have a constant offset with respect to the data signal in order to have a stabilized data signal when data bits are actually read out by a receiving device, the correctness of this timing within each cycle can be tested using the present method by placing strobe signals within this offset interval. One strobe signal validates, whether a new cycle of the data signal has already been started, while the other strobe signal validates, whether a new cycle of clock signal has not already started. In such an exemplary configuration, a combined pass condition is achieved, if both strobes yield no error in a compare, which means, that the Boolean operation can be realized by a logical "OR", when the pass condition is each expressed as a "0", or by a "NAND", when the pass condition is expressed as a "1".

In another exemplary case, transitions of data and clock cycles are considered, which are aimed to be coincident in time or phase. Herein, the strobe signals generated for the data signal and for the clock signal are also coincident. The validation of coincidence of the respective cycles of the signals involves scanning the strobes over the cycle transition with respect to phase. As a coincident error obtained by the compare step on both sides of the signals—clock and data—for a given cycle can be accepted for the reason that this event simply represents a coincident early or late transition, a logical "EXOR" (exclusive "OR") is the appropriate Boolean operation to combine clock and data pass or fail conditions in this case. However, the invention is not limited to these examples and other Boolean operations may be employed as well.

In a next step, it is checked, whether each data line associated with the interface yields a pass condition for a given cycle. If, e.g., just one data line, or data line test channel, out of a number of data lines (and its associated clock line), say 16 or 32, yields a fail condition, a summed "fail" or "1" results for this cycle. On a test device, such an operation can be arranged as a simple and fast "wired OR" operation.

A next step of the present method, e.g., can be to reduce the amount of data in the combined data structure, or matrix:

In the first exemplary case of a clock signal having a phase offset with respect to the data signal, this may be done by checking, whether for a given cycle there exists any phase or phase difference for a strobe signal, that provides a combined pass condition—and not only fail conditions. If at least one pass condition for that cycle exists, it is assumed that the receiving portion of two devices communicating with each other via a source synchronous interface is able accurately recover the correct bit content of the data signal. The result of this operation is just one pass or fail condition per cycle. This is valid for each group of data and clock. E.g., a logical "OR" can be performed on the error bits to accomplish this task.

Now that each cycle is checked for the pass or fail condition, a further logical operation can be applied, checking whether all of the cycles provide a pass condition. In case "pass" is represented by a "0", this operation may be, e.g., a logical "NAND". Alternatively, pass conditions can be complemented to be represented by a "1", in which case a logical "OR" can be applied, etc.

In the second exemplary case of clock and data signals having coincident transitions between the bit cycles, this is done by checking, whether there does not exist any phase or phase difference for a strobe signal that provides a combined fail condition for a given cycle—or in other words: whether there are only combined pass conditions for a given bit cycle.

It goes without saying that the specific set of logical operations provided in this document may alternatively expressed as a combination of other logical expressions in order to yield the desired results with respect to the error bit analysis, and that the invention extends to any of those combinations.

The final result of the present method then is just one pass or fail condition, according to which the device can be accepted or rejected.

In conclusion, according to the method of the invention, the data and clock signals of a device having a source synchronous interface are scanned sequentially or in parallel, both with respect to phase by strobes generated by an independent clock of the test equipment, and the results of a capture and compare for both kinds of signals are then combined using Boolean logic.

An advantage arises from the fact, that available test equipments already provide high precision timing for the generation and provision of strobe signal settings coincidently for each pin under investigation. The phase scanning with the strobes provides full coverage of both data and clock signals. Thereby, an analysis of what can be recovered from the transmitted signals by a second device communicating with the first device via the source synchronous interface, while effects like repetitive or random common phase jitter is present, is performed using Boolean operations. These operations are performed by hardware and/or software means provided by the test equipment.

The scanning of cycle phase by the strobes may either be performed by repeating the test sequence or by applying multiple strobes in parallel, or in other words, by strobes yielding more than one strobe per cycle, when being simultaneously applied to one test sequence, or shot.

It is clear that the invention can be partly or entirely embodied or supported by one or more suitable software programs, which can be stored on or otherwise provided by any kind of data carrier, and which might be executed in or by any suitable data processing unit. Nevertheless, the invention becomes particular advantageous if implemented as hardware with respect to a test-processor arranged on a test-board of the test device in conjunction with a CPU, wherein a test time reduction is accomplished, in particular, when each one test-processor is dedicated per pin.

BRIEF DESCRIPTION OF THE DRAWINGS

Other objects and many of the attendant advantages of embodiments of the present invention will be readily appreciated and become better understood by reference to the following more detailed description of preferred embodiments in connection with the accompanied drawings. Features that are substantially or functionally equal or similar will be referred to with the same reference signs.

FIG. 5 shows the error results of the method illustrated in FIG. 4 in a matrix representation each for clock and data and a combination of errors obtained by a Boolean "OR" operation;
FIG. 10 shows the compare results of a simulation for the multiple phase scan on the data pin as in FIG. 6, but in presence of a relative timing failure;
FIG. 11 shows results of a Boolean "OR" performed compare results of data as in FIG. 10 and on compare results of clock as in FIG. 7, this overlay indicating a relative timing error leading to a decision to reject the device;
FIG. 13a-d show different cases for a timing error of clock and/or data transitions according to the second embodiment.

DETAILED DESCRIPTION OF THE PREFERRED EMBODIMENT

Figure 1:
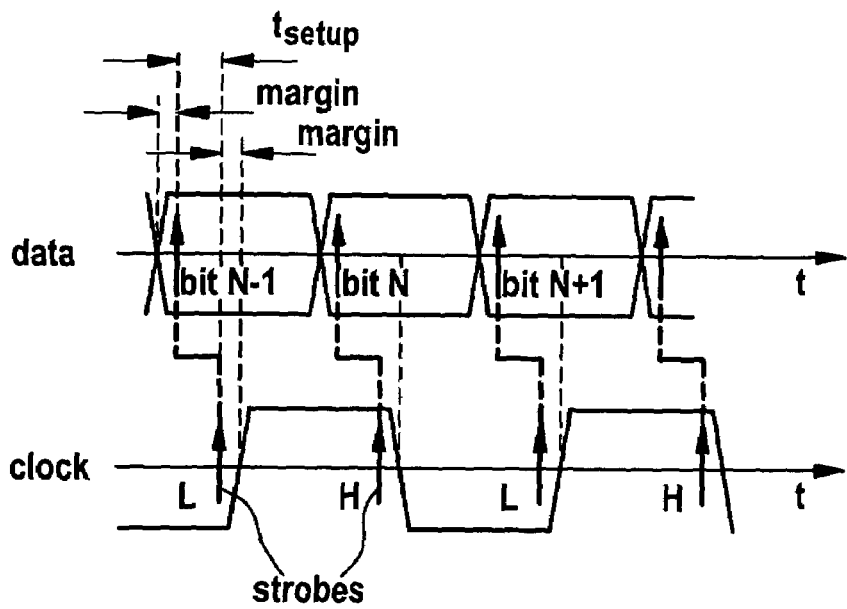
FIG. 1 illustrates a setup time compliant functional test.

In a first embodiment of the method according to the present invention specification based functional test is performed. Herein, both functional verification and testing a device under test with a timing and/or a level specification in a single functional test execution is achieved. Thus, it combines both the parametric and logical test when yielding the accept or reject decisions for that device. FIG. 1 shows an example of a setup time specification used for this first embodiment.

A similar embodiment could be demonstrated for a specification of a hold time, which sets a minimum time for holding the bit information at a stabilized level after this level has been sampled when a clock transition has occurred. In a sense, setup time and hold time together provide the length of the data eye.

The device under test (DUT) outputs the clock signal along with the data signals in the transmit portion of an I/O interface to provide a phase reference to the test device, i.e., its link partner. The setup time specification guarantees that the clock transition indicating the validity of the data occurs not before the data had been stable for a given time. For testing this specification in the same shot as the logical content of the data the strobe signal that samples the clock signal is delayed by the specified setup time compared to the strobe signal sampling and validating the data signal. With such a specification compliant test timing it can be ensured that neither the data transition nor the clock transition shift towards each other beyond an acceptable minimum, i.e., the setup time.

Margins indicated in FIG. 1 account for device specific phase variation. The setup time specification can only be tested for bits generating a data transition, which is always the case for the clock signal. However, adjacent bits with equal bit information occurring in the data signal might yield pass conditions provided the data content is correct.

If a large amount of common mode jitter is present both in the data and the clock transitions, a conventional test strategy using a single fixed set of strobe will presumably fail. Due to the common mode jitter clock and data cycle transitions move back and forth in phase simultaneously. With increasing jitter the margins diminish thereby causing fail conditions as soon as the transitions cross the fixed strobe time positions. As explained above the strobe time setting of a tester equipment itself suffers less from jitter than the transmitting device.

In case that a data receiving device, which is not a test device as according to this embodiment but a usual communication partner, operates with a source synchronous interface and communicates with the device (currently being under test), this receiving device and its interface is commonly capable of tracking the common mode phase variations. This is particularly the case, when dynamic phase tracking is part of the interface design architecture and the frequency is within the target tracking range. The present method of testing does not follow the approach of dynamic phase tracking as it is explained in the following.

Figure 2:
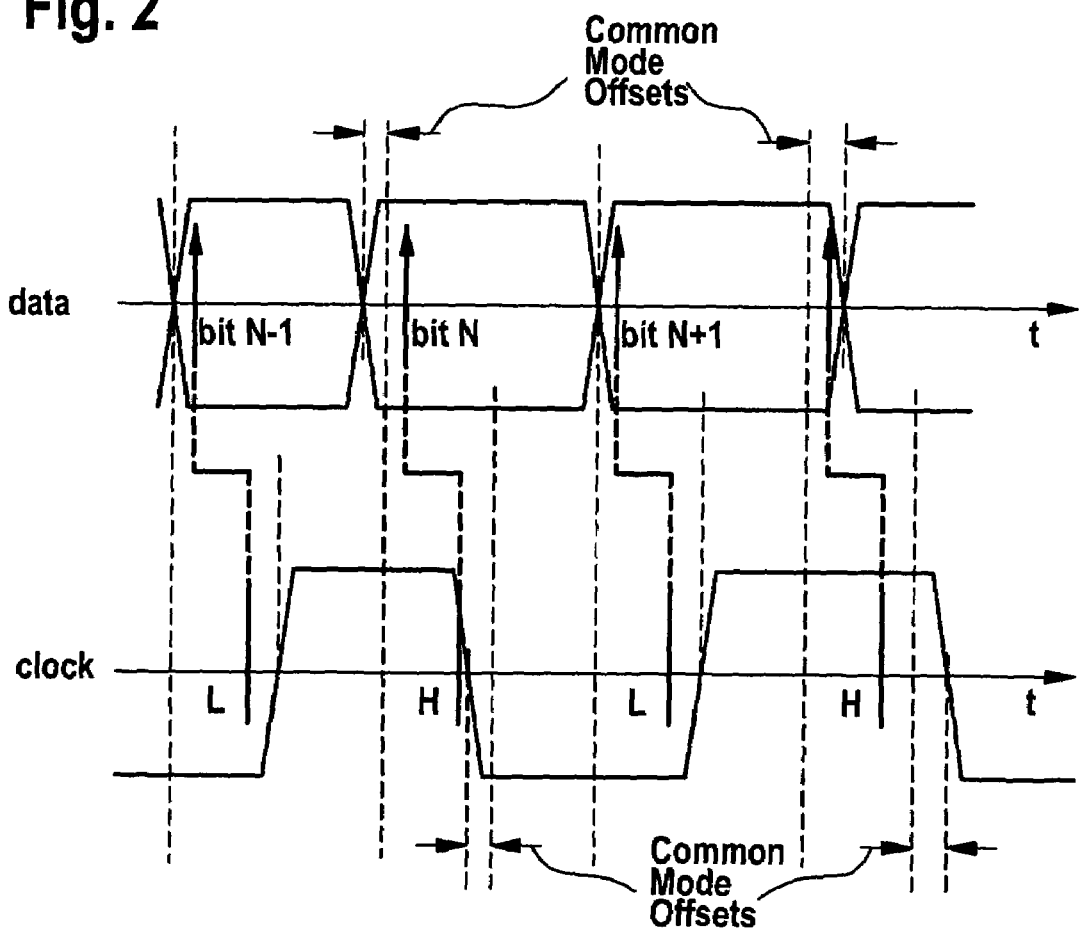
FIG. 2 shows a common representation of the specification based functional test as shown in FIG. 1 in presence of common mode jitter.
Figure 3:
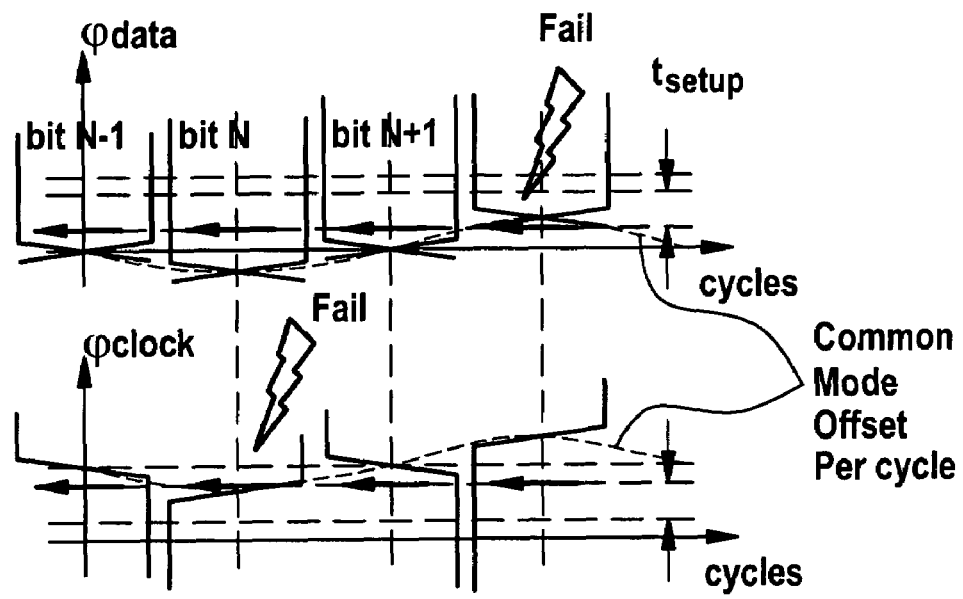
FIG. 3 shows slightly different representation as FIG. 2 that indicates the common jitter modulation (cycles tilted by −90°)

The impact of the common mode jitter is visualized with respect to phase modulation in FIGS. 2 and 3. Whereas FIG. 2 shows a conventional representation the signal level versus time along the x-axis, FIG. 3 displays the data bits of the individual cycles being tilted by 90° counterclockwise, such that the phase of each cycle is indicated by the position of the transition with respect to the y-axis as a function of time along the x-axis.

In such a representation the common mode jitter modulation signal, which for demonstration purposes in this case is a sinusoidal signal, becomes clearly visible as indicated by the dotted curve in FIG. 3. Comparing the strobe signal positions, which are indicated by arrows in the figures, with the jitter sinusoidal function, it becomes evident, that for the current strobe phase errors emerge with respect to the second bit cycle N of the clock signal and to the fourth cycle N+2 for the data signal.

Figure 4:
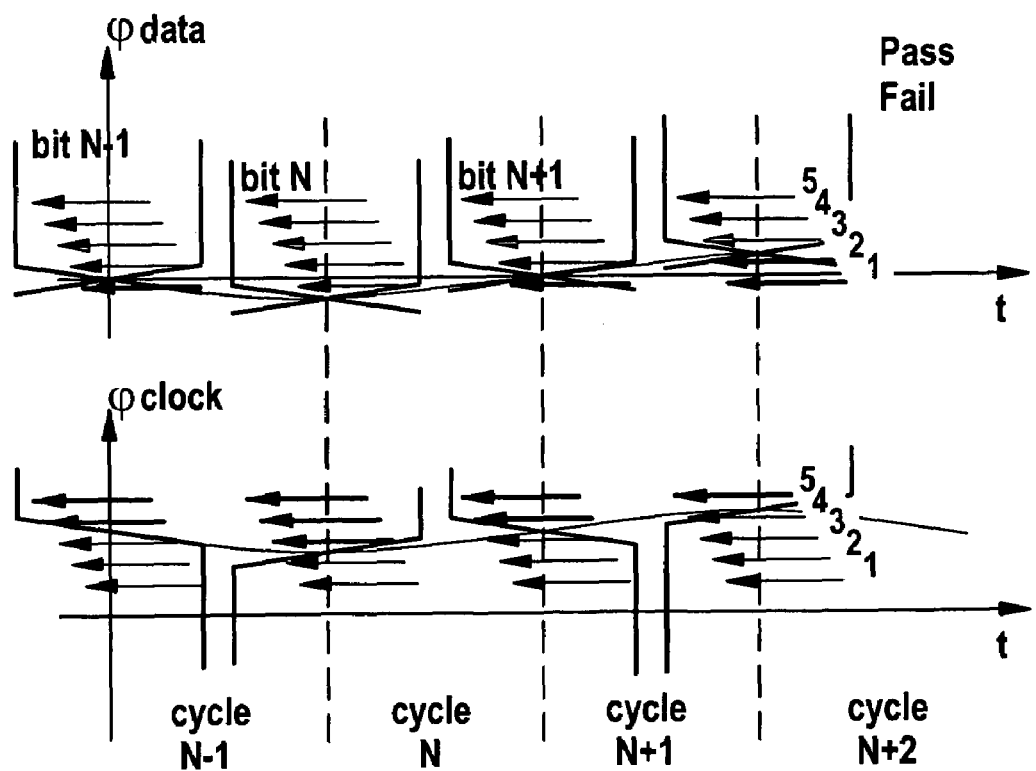
FIG. 4 illustrates a method of scanning the cycles with multiple fixed strobes (arrows) according to a first embodiment of the invention.
Figure 6:
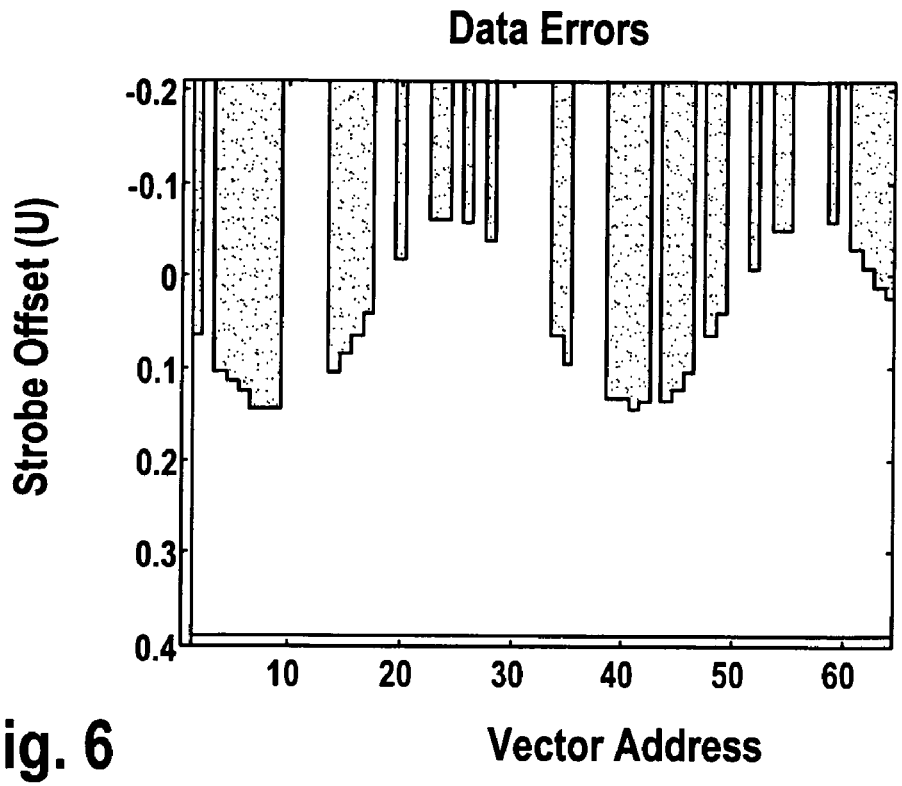
FIG. 6 shows a more detailed simulation of the compare results for the multiple phase scan on a data pin (x-axis: cycle number; y-axis: phase; dark grey: fail; light grey: pass)

In a next step shown in FIG. 4, cycles are repeatedly scanned with multiple fixed strobes to identify if there is at least one strobe for which the given specification, e.g. the setup time, is fulfilled. In this simple embodiment the scan uses equally phase spaced multiple strobes. However, according to an alternative embodiment, it is possible to use an unequal/nonlinear spacing of the strobes. For each phase difference of a strobe with respect to a fixed cycle time, errors occur depending on the phase of the strobe. The errors occur at different instances for the clock and data signal. Nevertheless, once an error had occurred for a given phase of the strobe either for the clock or for the data, the corresponding bit cycle attains a fail condition with respect to that phase.

Further, there are also strobes in each cycle that do not reveal errors—neither for the clock signal nor for the data signal. Accordingly, that bit cycle delivers the correct result for the given phase of the strobe signal. However, these error free strobes occur at different phases for each of the bit cycles N−1, . . . , N+2 shown in FIG. 4. As now a usual data receiving device is able to track these phase variations by means of dynamic phase tracking, the cycles indicated in FIG. 4 are herein considered to fulfill the setup time specification when at least one phase scan step in that bit cycle attains a pass condition.

According to this first embodiment, the data and clock signals are strobe-sampled to full coverage of many (subset of all cycles of a shot) or all bit cycles and extensively with respect to phase. FIG. 4 just schematically reveals four sampled bit cycles and five applied phase differences of respective strobes, i.e. a 5 rows vs. 4 column portion of a considerably larger matrix. The entries in the matrix are a "0" for pass or a "1" for fail (indicated by the gray or black underlay of the strobe arrows in FIG. 4). These values are obtained each for the data and the clock signal, separately.

Next, post-processing is performed on these matrix entries after these have been sampled by the strobes, compared and stored as error results (pass or fail, "0" or "1"). The rows represent the cycle number and the columns represent the phase scan step number. Phase steps in a cycle that comply with the setup time specification as explained above are determined by means of a Boolean "OR" operation between all corresponding entries of the matrices for each data and clock signal. Sample portions of the matrices corresponding to the situation displayed in FIG. 4 are shown in FIG. 5, wherein the resulting combined matrix is shown at the bottom.

FIG. 5 reveals, that the matrix used to store the Boolean OR result, reflects the common mode phase variation with a band of zeros that follows the modulation signal indicated by a dotted curve. The width of this band represents the setup time margin.

The boundaries that form the band may or may not be correlated, and post-processing of these data can be used to further assist analysis and debugging. In particular, cross-correlation and further statistical analysis can be performed on these data.

The result of a full simulation of the method is shown in FIGS. 6-11. One data pin and a clock pin with 64 cycles and 60 phase strobe compare steps is used. A sinusoidal common mode jitter amounts 0.2 Ulpp. The setup time specification was set to 0.05 Ul and the actual setup time amounts to 0.14 Ul leaving a margin of 0.09 Ul. The simulation further contained a 0.1 Ulrms jitter on the sampling strobes to reflect noise of the tester system. Pass condition results for a strobe are shown each in a light grey and an error is indicated with a dark grey. The strobe phase scan steps start at −0.2 Ul outside the cycle and proceed with a 0.01 Ul step size until +0.4 Ul almost in the cycle centre.

The compare result for the data signal (see FIG. 6) reveals errors as long as the result is sampled outside the data eye. In this region columns with full pass conditions occur occasionally among regions reflecting fail condition. This happens due to adjacent bits, which represent the same logical value, i.e., no transition occurs at the bit cycle boundary. Thus, even when the strobe is positioned outside the bit cycle no fail condition is encountered, which is called a blind bit. As the strobe signal phase enters respective bit cycles pass conditions are encountered. Due to the repetitive common mode jitter encountered here the pass/fail boundary also moves in sinusoidal form.

Figure 7:
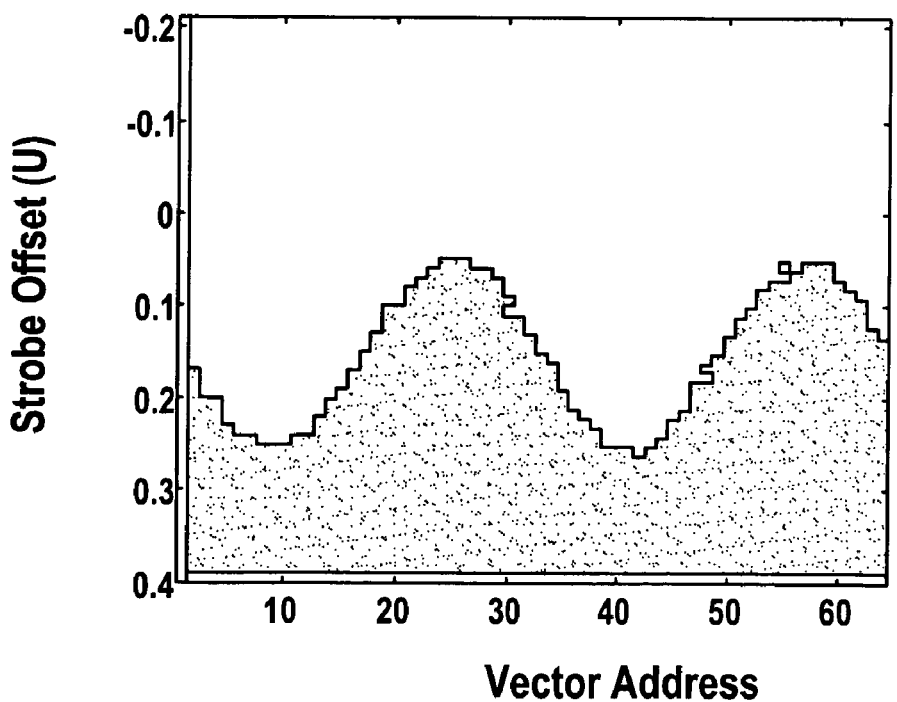
FIG. 7 shows compare results for the multiple phase scan as in FIG. 6, but for the clock pin (axes as in FIG. 3 or 6)

FIG. 7 analogously shows the result of scanning the clock signal with multiple phase steps with each step being represented by different strobes. However, fail conditions are encountered here towards negative values of the (absolute) phase since the corresponding clock strobe leaves the clock bit cycle when data strobe tends to enter the corresponding data bit cycle as both co-move in phase or time.

Figure 8:
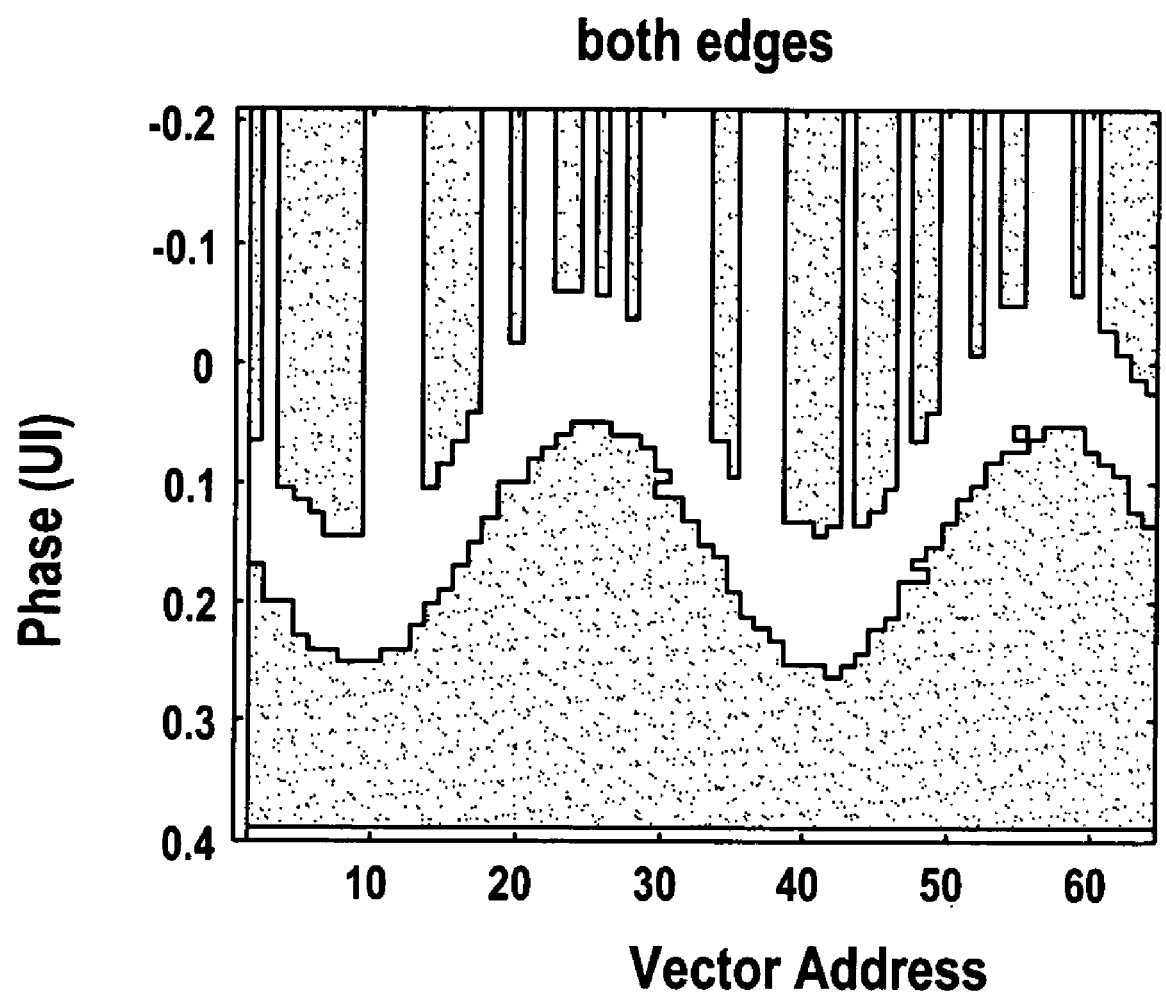
FIG. 8 shows the results of a Boolean "OR" operation performed on the error bits (fail: dark grey, pass: light grey) for clock (FIG. 6) and data (FIG. 7) for the multiple phase scan.

FIG. 8 reflects the overlay of both matrices performed by means of the Boolean "OR" operation applied to each of the associated matrix entries. An error-free band of 0.09 UI width reflecting the setup time margin with respect to the used specification is visible as well as the sinusoidal shape of the common mode jitter modulation with an amplitude of 0.2 Ulpp on both pass/fail boundaries. Using just one single-phase step to test the device would yield no contiguous pass over all cycles due to the tremendous jitter.

Next, an overall pass condition is determined by verifying that the Boolean "OR" yields a pass for at least one phase step in each individual bit cycle regardless of whether it occurs in adjacent cycles.

Figure 9:
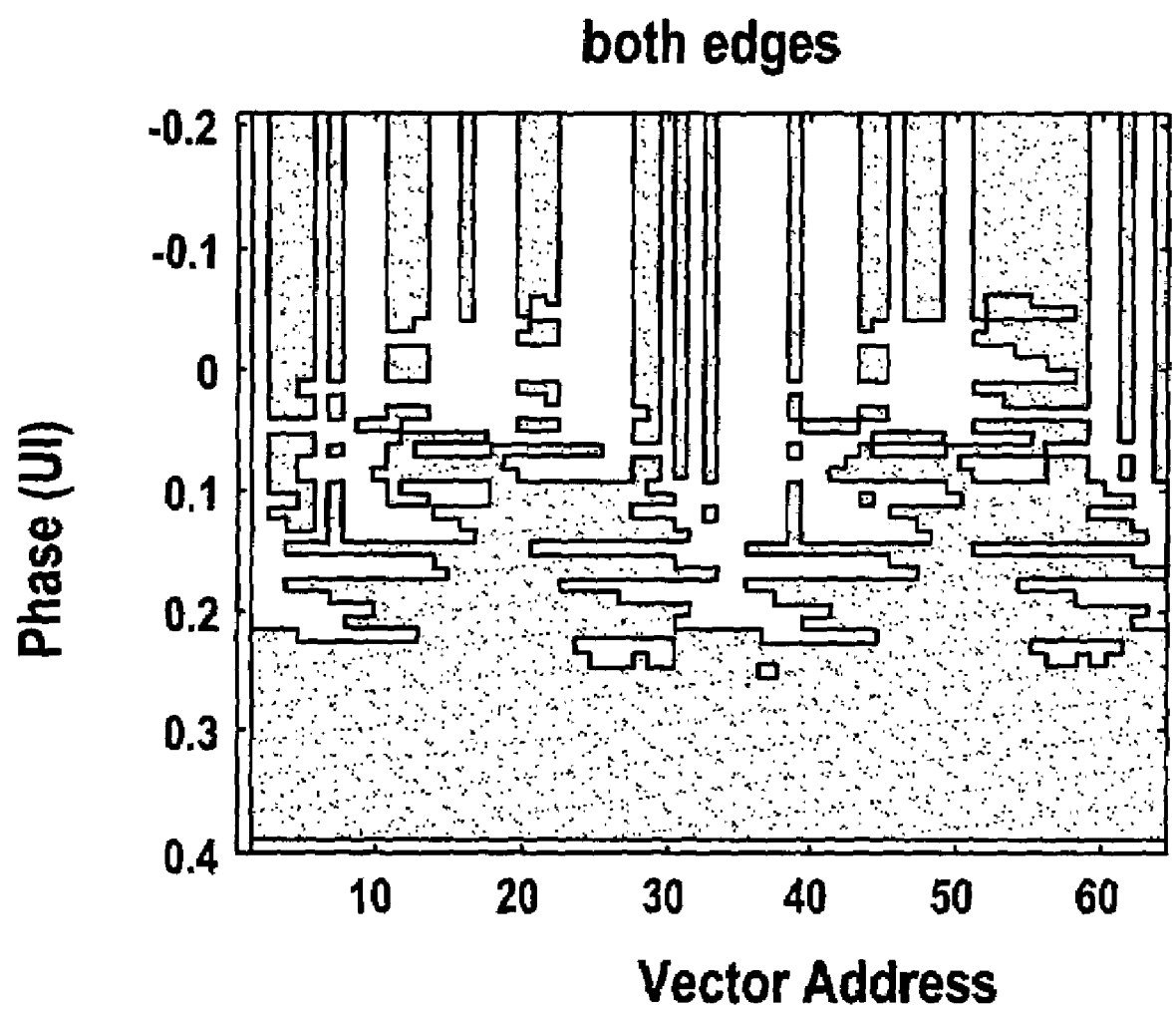
FIG. 9 shows the results of a Boolean "OR" operation of a sequential phase scan as in FIG. 8, but for the case of asynchronous common mode jitter.

The case of an asynchronous, non-repetitive common mode jitter is shown in FIG. 9. A careful study of the matrix, or graph, proves that the condition for a pass is met since for each cycle there is at least one phase step that yields a pass, which also could be tracked by a usual partner device linked to the device presently under test by means of phase tracking. Even though in most of the applications it is expected that the sources for the common mode jitter are tied to the test pattern executed on the device, it is an important advantage that the method also covers the asynchronous, random case.

Next, the case of a defect reflected by a relative timing failure or differential jitter between clock and data is considered. As expected, such a failure has the consequence that in one (or more) cycle(s) no pass is obtained on both the clock signal and the data signal, regardless of what phase position for the strobes is selected. In other words, even when the common mode jitter offset for the respective bit cycle undergoing a fail condition would be known in advance, the strobe signals for clock signal and the data signal, both spaced apart by the setup time specification, cannot be adjusted such that both strobes result in a pass condition for that cycle. This test condition reflects the case that a usual device partner linked to the present DUT via a source synchronous interface as well cannot track this phase variation.

FIG. 10 shows the simulation of such a case with respect to the data signal strobe and compare results, wherein a relative timing error occurs in cycle 10. A 0.2 UI delay on the data transition for that cycle was applied in this cycle to simulate the failure. This results in errors that extend 0.2 UI beyond the regular sinusoidal pass/fail boundary in cycle 10. The clock signal matrix is similar to that of FIG. 7. Having applied a Boolean "OR" operation, the resulting matrix reveals a pattern as shown in FIG. 11. In this graph the column associated with the tenth bit cycle interrupts the sinusoidal pass band due to the extended fail conditions and thus proves the unique detection criteria of the present method.

A similar graph as shown in FIG. 11 can be generated for a relative timing failure on the clock signal that would advance the clock transition towards the start of the cycle. One key difference however exists for clock and data. When the source for the relative timing error is activated in a cycle corresponding to a blind bit, no transition occurs and thus a failure generating process has no impact.

A second embodiment of the present invention relates to a source synchronous interface, which transmits data and clock signals having no phase offset, i.e., transitions of bit cycles are in phase. Those implementations often relate to high-speed memory architectures, as for example DDR-memory (Double Data Rate). In this case no setup time specification needs to be tested, rather the synchronism of both transitions is subject of a test as explained in what follows.

Figure 12:
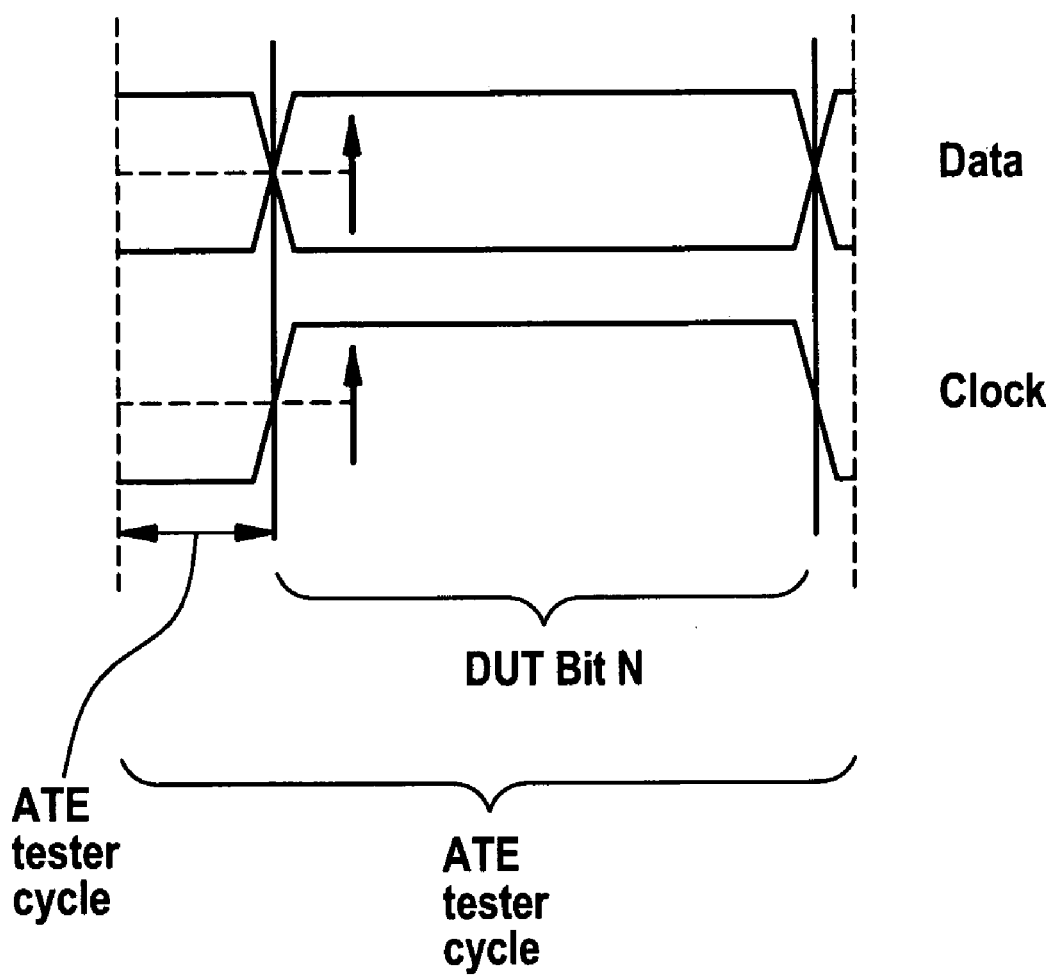
FIG. 12 shows a setup of a second embodiment of the invention.

As in the first embodiment, the test device receives the data signal as well its associated clock signal. Strobe signal settings are generated to sample the bit information contained in cycles of both signals. Therein, the phase difference relative to an assumed transition is scanned through by generating multiple strobes. An example can be seen in the schematic drawing of FIG. 12. Both strobes of the respective settings for clock and data (indicated by arrows) are coincident in time, or phase respectively, as synchronism of transitions is to be tested in this embodiment. However, the size of the data and clock eye as well as the relative position in phase are yet unknown. Thus, in order to detect errors and/or unacceptable delays the bit cycles are scanned by varying the phase of the strobes with respect to cycle transitions.

Figure 13C:
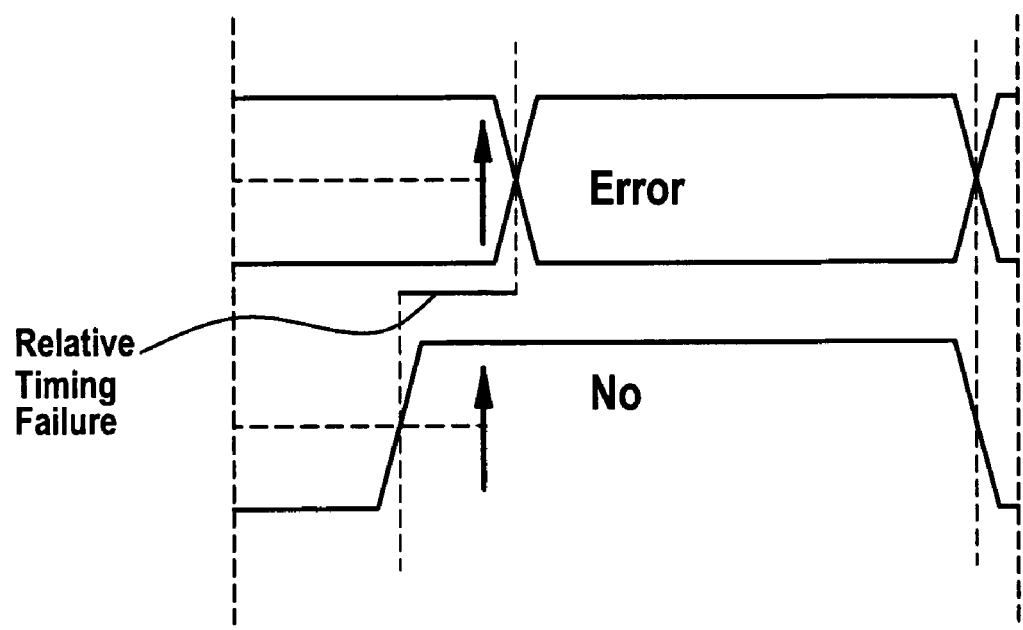
Figure 13D:
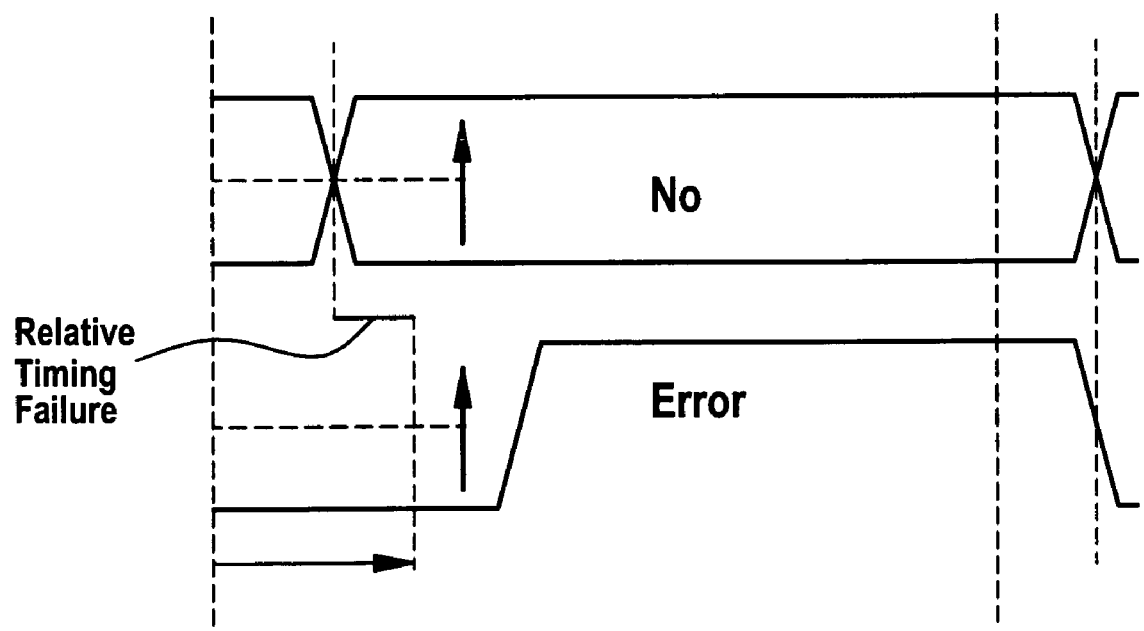

The occurrence of common mode jitter is comparatively harmless to source synchronous interfaces using phase tracking, which can be seen in FIGS. 13a-d. FIG. 13a represents the case, wherein the strobes are positioned within the cycle, to which they are assumed to be related according to a predetermined bit information sequence. Further, the transitions of both data and clock are synchronous. As a result, the validation step with a capture and compare according to the method of the invention yield a pass condition for this cycle and this phase, as indicated in FIG. 13a, both for clock and data. The same is valid if both strobes for clock and data coincidently fall outside the cycle, which is illustrated in FIG. 13b.

The phase setting for the strobe each of data and clock do not have an offset such as in the previous embodiment. However, they are coincident in phase. In the case of common mode jitter both yield pass and fail conditions. If both signals yield pass conditions or both yield a fail condition, the global result is a pass condition. A global fail only occurs, when either a clock strobe fails in one cycle and the data strobe passes in the corresponding data cycle, or vice versa, which can be seen in FIGS. 13c and d.

Consequently, an appropriate logical operation to combine the compare results of clock and data can represented by an exclusive "OR".

Figure 14:
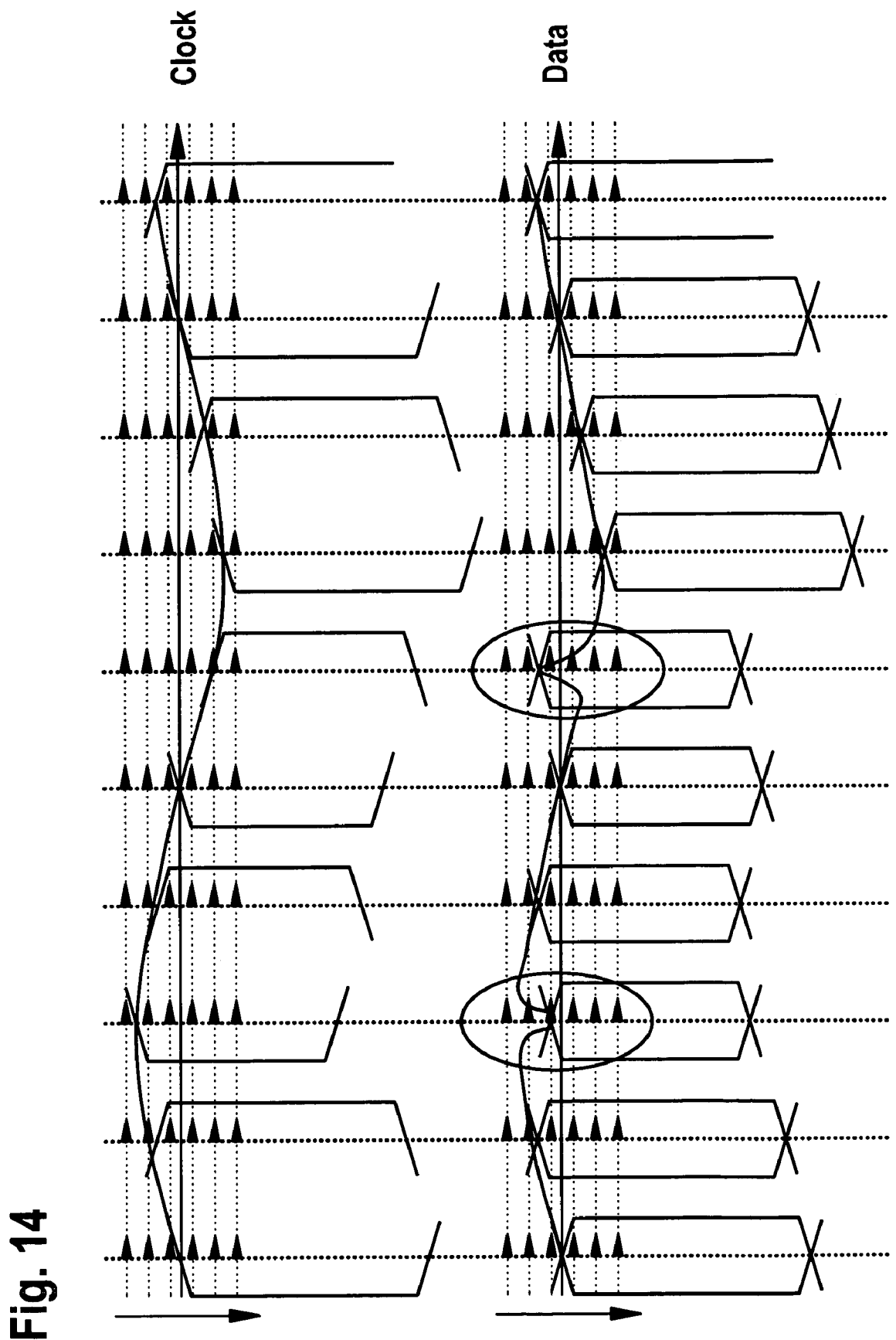
FIG. 14 visualizes an application of the method of the second embodiment according to present invention.

FIG. 14 is a representation of strobes generated with differing phase $\phi$ with regard to the cycles of clock and data, which is similar to the representation shown in FIG. 3 for the first embodiment. The cycles are tilted by 90 degrees in this representation. The y-axis corresponds to the phase offset, the x-axis represents the cycle number, wherein 10 cycles are schematically shown. As indicated by the curve in the upper portion (clock) and the bottom portion (data) of the diagram, a sinusoidal jitter is present. The curve is drawn to connect the transitions of the cycles. Horizontal arrows indicate the phase of the strobes. Strobe arrows along each of the dotted horizontal lines refer to the same strobe. Strobes, which lie above this transition curve yield an error after the compare, those below that curve yield a pass condition.

Two instances of timing failures occur in the bit sequence of the data signal, one in the third cycle, the other in the sixth cycle shown in FIG. 14. Each two strobes are involved in data, which accordingly yield an additional fail condition, which is not simultaneously the case for the corresponding cycles in the clock signal.

Figure 15:
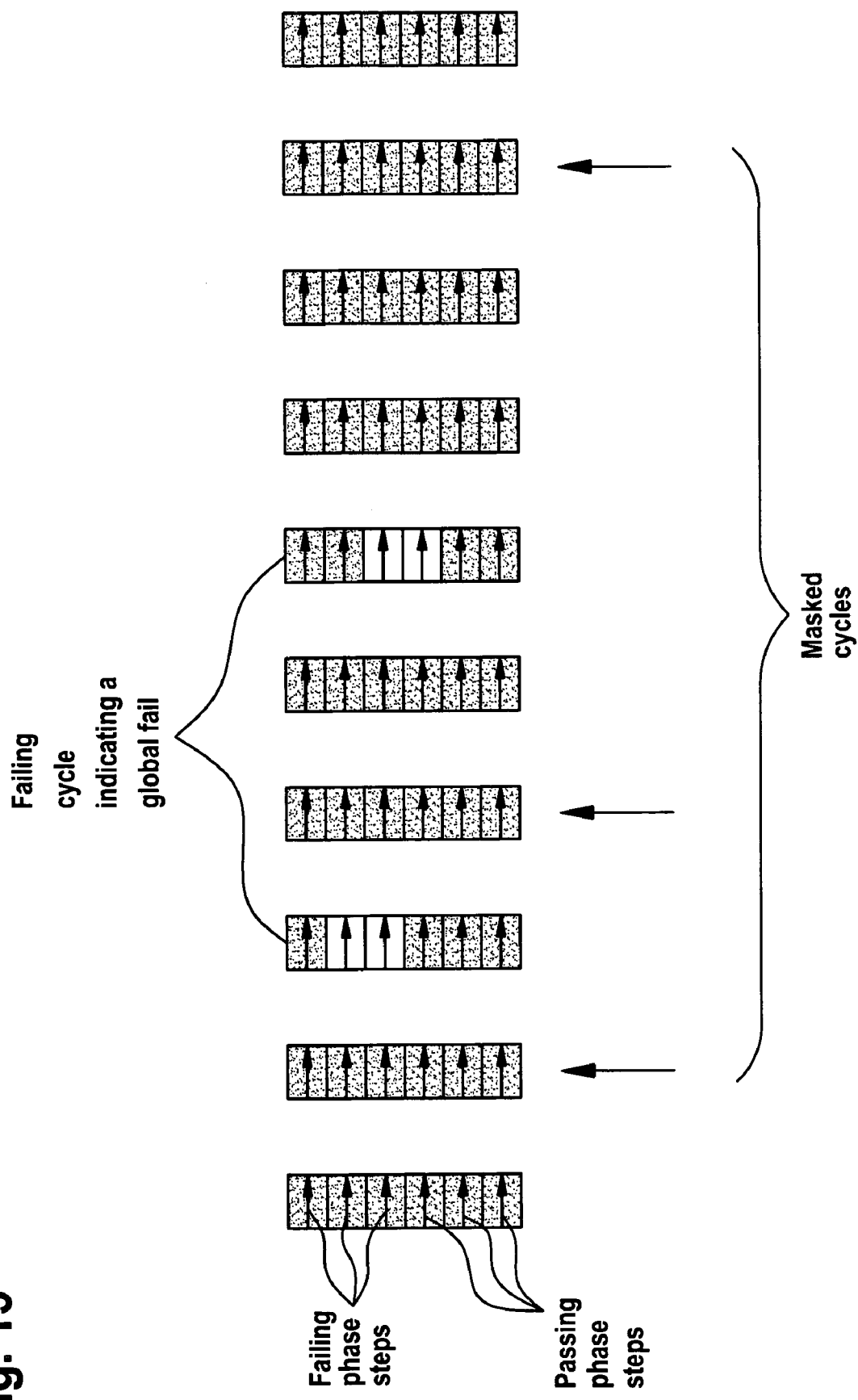
FIG. 15 shows a matrix representation of the results of a Boolean exclusive "OR" operation according to the second embodiment.

The results of the exclusive "OR" operation are shown in the matrix representation of FIG. 15. Fail conditions are thus present in Column 3, Rows 2 and 3 as well as Column 6, Rows 3 and 4.

Further, according to this second embodiment, columns of the matrix, which correspond to cycle numbers which actually do not exhibit a transition of bit levels, i.e. two consecutive bits of are the same, show no error values at all. The clock signal however will in any case have some test strobes with large phase falling outside the clock data eye yielding an error in a compare. As a consequence, the exclusive "OR" will also yield an error for these strobes.

To circumvent this problem, those cycles corresponding to cases where no transition occurs, are masked prior to performing the Boolean operation, as indicated for the second, fourth, and ninth column (cycles) in FIG. 15.

Figure 16:
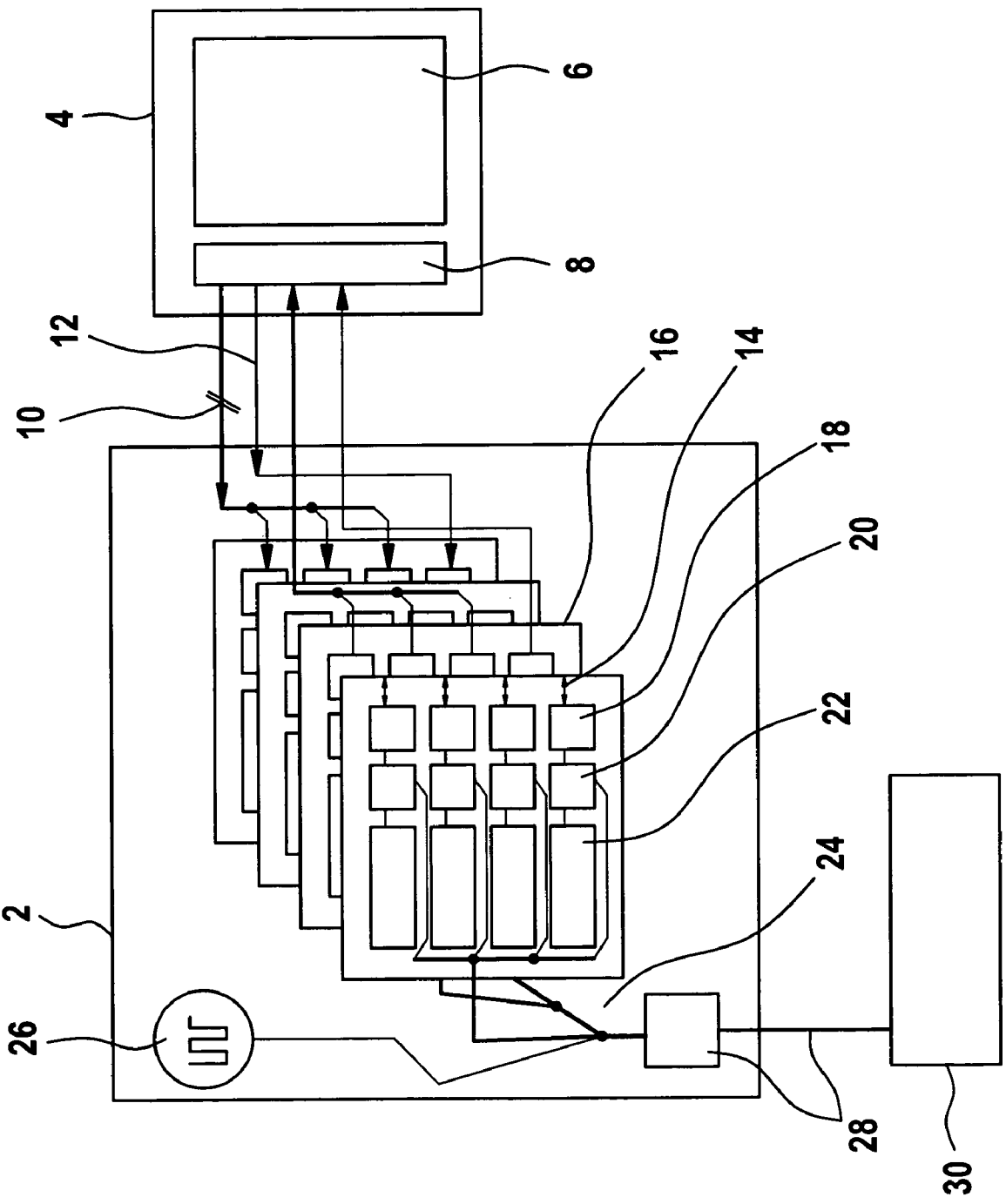
FIG. 16 is a schematic representation of a hardware configuration of a test device according to the third embodiment.

The present invention may advantageously be embodied in a hardware configuration of a test device, e.g. an ATE 2 such as indicated in a third embodiment shown FIG. 16. Available tester-per-pin architectures such as those conceived and fabricated by the applicant, Agilent Technologies, Inc., Palo Alto, Calif., provide large amounts of unified memory 22 available per pin 14 and thus large storage capacity for the compare result per cycle and per compare strobe (i.e. scanned phase). The hardware architecture of the test-processor 20, which in this case is associated to a tester channel (data line) enables an acceleration compared to a purely software-based post-processing using only the CPU of the controller 30 of the ATE 2.

The ATE 2 comprises a tester clock 26, further an interface 28 to a controller 30, and a number of tester channel boards 16. In the figure, each board has four tester channels each comprising a pin 14, a front-end unit 18, a test-processor 20 and a unified channel memory 22. Each pin is connected with one of the data lines 10 or with the clock line 12, which form a connection to the source synchronous interface 8 of the device under test 4, which further has a core logic 6.

According to this embodiment, the test-processor 20 represents a logical operation unit arranged to perform a Boolean logical operation between the comparison results for each of corresponding cycles of the data signal and the clock signal and for each compare strobe. Therein, it attributes a combined pass or fail condition to each cycle and each adapted phase of both signals.

Prior to applying the Boolean operation using the test-processor 20, each of the analog signal levels incoming at the respective pins 14 of the tester channels are first converted to discrete levels reflecting a binary information content using level comparators. Then, a sample unit uses the predefined strobes to sample the binary signal to obtain discrete bit values at the given (discrete) strobe timings. Subsequently, the test-processor 20 automatically performs the compare step and the Boolean "OR" with respect to the combined error results of the clock and data signals.

The comparator and the sample unit, which form a front-end unit 18, yield a time and value discrete signal, which can then be processed by the test-processor 20 that represents a logical operation unit. Both front-end unit 18 and test-processor 20 can efficiently handle large data volumes. Further, both the front-end unit 18 and the test-processor 20 can be associated with one pin-electronic channel unit, which comprises a further unit memory used to store the data volumes. The test-processor 20 therein stores the sampled bit sequence as well as expected bit sequence and further the compare results from both sequences. According to an advantageous refinement, a unit memory of another unused test-processor, i.e., another pin-electronic channel unit, can be used to intermediately store the results of the Boolean operations as follows.

Advantageously, when the result of a Boolean "OR" from one phase scan step is returned by the test-processor, it can be stored to an unused channel memory of another pin, which is currently not part of the group of test channels assigned to the source synchronous bus under test. The test processor 20 uses this temporarily assigned channel memory to sum up the pass conditions incrementally over all phase scan steps to obtain a summed pass or fail result for each cycle.

In a further refinement, the test-processor 20, which corresponds to a respective tester channel, can be arranged to sum up the pass or fail results of all cycles stored in the temporary channel memory to form the global test result, which in this embodiment is accomplished by a Boolean "AND" operation.

Alternatively, these results obtained by further Boolean operations can be achieved by means of a backplane unit that is arranged between the front-end unit 18 and the controller/ the CPU. In any case, the results can then be reported to the application layer of the ATE software, or firmware. The firmware controls all intermediate steps while the test-processor 20 executes the logical operation at raw hardware speed. A single pass or fail is reported to the controller for each clock domain that is part of the source synchronous bus interface under test.

Moving the post-processing to the hardware of the front-end unit 18 and/or the backplane unit 24 therefore results in a throughput improvement of several orders of magnitude, compared to the case where all raw data would be uploaded and the controller would have to accomplish the post processing in order to obtain the final accept or reject decision.

What is claimed is:

1. A method of testing a device under test, which is adapted to transmit a digital data signal and a clock signal, the data signal being related to the clock signal, to a test device, comprising the steps of:

sampling within one clock cycle of a local clock signal the data signal and the clock signal by applying a number of strobes for obtaining a corresponding number of bit values each for the data signal and for the clock signal, the strobes having different phase offsets with respect to the local clock signal, deriving first comparison results for the sampled bit values of the data signal by comparing the sampled bit values of the data signal each with an expected data bit value according to expected data, deriving second comparison results for the sampled bit values of the clock signal by comparing the sampled bit values of the clock signal each with an expected clock bit value, deriving combined comparison results by applying logical operations each on pairs of corresponding first comparison result and second comparison result, deriving a test result for the data of said clock cycle based on the combined comparison results, and outputting said test result for further use.

2. The method of claim 1, wherein the logical operation is one of a Boolean OR operation and an Exclusive OR operation and the step of deriving the test result comprises one of:

(a) checking, whether for each clock cycle there exists at least one strobe, which yields a combined pass result or (b) checking, whether for each clock cycle there exist only strobes, which yield a combined pass result.

3. The method of claim 1, wherein the device under test is accepted or rejected in response to test results of a plurality of clock cycles of the test device clock.

4. The method of claim 1, wherein the clock signal and the data signal are sampled sequentially with respect to each strobe.

5. The method of claim 1, wherein the test device comprises a plurality of data pins, which provide each a data signal and an associated clock pin providing said clock signal, performing the logical operation to combine each of the first comparison result with the corresponding second comparison result to determine corresponding combined comparison results, and deriving a test result for each of the data of said clock cycle based on each of the combined comparison results.

6. The method of claim 1, wherein the test device first inputs a stimulus signal comprising data and/or instructions into the device under test, such that said device under test generates the data signal and the clock signal in response to said input stimulus signal.

7. The method of claim 1, wherein a clock signal is transmitted by a source synchronous interface of the device under test, such that said clock signal shows transition edges with a constant phase offset with respect to transition edges of its associated data signal transition edges.

8. The method of claim 7, wherein the data signal is sampled according to first strobes and the clock signal is sampled according to second strobes, both strobe sets or offset to each other by a defined phase value.

9. The method of claims 1, wherein a pass result of the comparison results is represented by a logical "0", and a fail result is represented by a logical "1", and the logical operation, which is applied for receiving the combined comparison result is one of: a logical OR or a logical NOR or a logical "exclusive OR" (EXOR) operation.

10. The method of claim 9, wherein the step of deriving combined comparison results further comprises:

performing a second logical operation on the plurality of combined comparison results, which refer to different strobes, in order to obtain the test result for the clock cycle.

11. The method of claim 10, further comprising:

calculating one final accept or reject decision for the device by performing a third logical operation on the test results of a plurality of clock cycles.

12. The method of claim 11, comprising the further steps of:

determining cycles of the data signal, where no transition of the bit information with respect to an adjacent previous cycle occurs, and masking any comparison result obtained with respect to the determined cycles prior to performing the second or third logical operation.

13. The method of claim 1 wherein the strobes are equally spaced with respect to their phase offset with respect to the clock signal of the test device.

14. A software program or product, preferably stored on a data carrier, for controlling the executing the method of claim 1, when run on a data processing system of the test device.

15. A test device testing a device under test, which is adapted to transmit a digital data signal and a clock signal, the data signal being related to the clock signal comprising:

a sampler sampling within one clock cycle of a clock signal of a local clock the data signal and the clock signal by applying a number of strobes for obtaining a corresponding number of bit values each for the data signal and for the clock signal, each of the strobes having a different phase offset with respect to the clock signal, a comparator deriving first comparison results for the sampled bit values of the data signal by comparing the sampled bit values of the data signal each with an expected data bit value according to expected data, and deriving second comparison results for the sampled bit values of the clock signal by comparing the sampled bit values of the clock signal each with an expected clock bit value, a processor deriving combined comparison results by applying logical operations each on pairs of corresponding first comparison result and second comparison result, and for deriving a test result for the data of said clock cycle based on the combined comparison results.

* * * * *